(12) United States Patent
Sugawara et al.

(10) Patent No.: US 10,770,483 B2
(45) Date of Patent: Sep. 8, 2020

(54) THIN FILM TRANSISTOR, DISPLAY DEVICE AND METHOD FOR MANUFACTURING THIN FILM TRANSISTOR

(71) Applicant: SAKAI DISPLAY PRODUCTS CORPORATION, Sakai-shi, Osaka (JP)

(72) Inventors: Yuta Sugawara, Sakai (JP); Satoshi Michinaka, Sakai (JP); Nobutake Nodera, Sakai (JP); Takao Matsumoto, Sakai (JP)

(73) Assignee: SAKAI DISPLAY PRODUCTS CORPORATION, Sakai-shi, Osaka (JP)

( * ) Notice: Subject to any disclaimer, the term of this patent is extended or adjusted under 35 U.S.C. 154(b) by 0 days.

(21) Appl. No.: 16/373,361

(22) Filed: Apr. 2, 2019

(65) Prior Publication Data
US 2020/0006396 A1     Jan. 2, 2020

(30) Foreign Application Priority Data
Jun. 28, 2018    (JP) ................................ 2018-123446

(51) Int. Cl.
     *H01L 27/12*      (2006.01)
     *H01L 29/24*      (2006.01)
     (Continued)

(52) U.S. Cl.
     CPC ........ *H01L 27/1229* (2013.01); *G02F 1/1368* (2013.01); *H01L 27/1225* (2013.01);
     (Continued)

(58) Field of Classification Search
None
See application file for complete search history.

(56) References Cited

U.S. PATENT DOCUMENTS

| | | | |
|---|---|---|---|
| 2005/0218403 A1* | 10/2005 | Kuo | ................... H01L 29/66765 257/59 |
| 2010/0065851 A1* | 3/2010 | Makita | .................... H01L 27/12 257/72 |

(Continued)

FOREIGN PATENT DOCUMENTS

| | | |
|---|---|---|
| JP | 2012-114131 A | 6/2012 |
| JP | 2012-253752 A | 12/2012 |

(Continued)

*Primary Examiner* — Herve-Louis Y Assouman
(74) *Attorney, Agent, or Firm* — ScienBiziP, P.C.

(57) ABSTRACT

A thin film transistor includes: a gate electrode supported on a substrate; a gate insulating layer that covers the gate electrode; an oxide semiconductor layer provided on the gate insulating layer and having a crystalline region, the crystalline region including a first region, a second region, and a channel region located between the first region and the second region, wherein the channel region, the first region and the second region overlap with the gate electrode with the gate insulating layer interposed therebetween; a protection insulating layer arranged on the oxide semiconductor layer so that the channel region is covered and the first region and the second region are exposed; a source electrode electrically connected to the first region; and a drain electrode electrically connected to the second region, wherein a crystallinity of the channel region is different from a crystallinity of the first region and the second region.

17 Claims, 10 Drawing Sheets

(51) Int. Cl.
    *H01L 29/786*     (2006.01)
    *H01L 29/66*     (2006.01)
    *H01L 21/428*     (2006.01)
    *G02F 1/1368*     (2006.01)
    *G09G 3/36*     (2006.01)

(52) U.S. Cl.
    CPC .......... *H01L 27/1285* (2013.01); *H01L 29/24* (2013.01); *H01L 29/66969* (2013.01); *H01L 29/7869* (2013.01); *H01L 29/78606* (2013.01); *H01L 29/78696* (2013.01); *G02F 2202/10* (2013.01); *G09G 3/3677* (2013.01); *G09G 3/3688* (2013.01)

(56) References Cited

U.S. PATENT DOCUMENTS

| | | | |
|---|---|---|---|
| 2010/0203673 A1* | 8/2010 | Hayashi | H01L 29/78618 438/104 |
| 2011/0062436 A1* | 3/2011 | Yamazaki | H01L 29/04 257/43 |
| 2012/0220140 A1 | 8/2012 | Kajiyama et al. | |
| 2012/0281455 A1 | 11/2012 | Endo | |
| 2015/0171221 A1 | 6/2015 | Miki et al. | |
| 2016/0211382 A1* | 7/2016 | Yamazaki | H01L 29/78693 |
| 2017/0054029 A1* | 2/2017 | Koezuka | H01L 21/02557 |
| 2017/0162709 A1 | 6/2017 | Nodera et al. | |
| 2018/0097120 A1 | 4/2018 | Ishida et al. | |
| 2018/0122839 A1 | 5/2018 | Nodera et al. | |

FOREIGN PATENT DOCUMENTS

| | | |
|---|---|---|
| JP | 2014-140005 A | 7/2014 |
| JP | 2014-225626 A | 12/2014 |
| JP | 6275294 B2 | 2/2018 |
| WO | 2011/055618 A1 | 5/2011 |
| WO | 2011/132559 A1 | 10/2011 |
| WO | 2016072024 A1 | 5/2016 |
| WO | 2016/157351 A1 | 10/2016 |
| WO | 2016/170571 A1 | 10/2016 |
| WO | 2017/158843 A1 | 9/2017 |

\* cited by examiner

THIN FILM TRANSISTOR, DISPLAY DEVICE AND METHOD FOR MANUFACTURING THIN FILM TRANSISTOR

BACKGROUND

1. Technical Field

The present invention relates to a thin film transistor, a display device, and a method for manufacturing a thin film transistor.

2. Description of the Related Art

Thin film transistors (TFTs) have been widely used as switching elements of pixels in display devices such as liquid crystal display devices and organic EL (Electro-Luminescence) displays, for example.

A thin film transistor includes a gate electrode, an insulating layer, a semiconductor layer (channel layer), a source electrode and a drain electrode formed on a substrate. Thin film transistors of the bottom gate-type, among other types, are characterized in that the gate electrode is formed on the substrate side relative to the channel layer.

In recent years, a thin film transistor (oxide semiconductor TFT) has been developed that uses an oxide semiconductor instead of a silicon semiconductor (an amorphous silicon, a polycrystalline silicon, etc.) in the active layer of the thin film transistor. An oxide semiconductor TFT is advantageous in that it has a higher electron mobility than an amorphous silicon thin film transistor, and a smaller off current than a polycrystalline silicon thin film transistor.

For example, Japanese Laid-Open Patent Publication No. 2014-225626 discloses a bottom gate-type oxide semiconductor TFT having an active layer made of an amorphous oxide semiconductor. Japanese Laid-Open Patent Publication No. 2014-225626 also discloses a structure (referred to as an "etch stop structure") in which an etch stop layer is provided on a portion of the active layer of the oxide semiconductor TFT for the purpose of protecting the active layer when etching the source-drain electrode.

SUMMARY

With the increase in the size and resolution of display devices, there has been a demand for further increasing the mobility of the thin film transistor to improve the ON characteristic. Note that in the present specification, the mobility of a portion of the active layer of the thin film transistor that is to be the channel is referred to as "the mobility of the thin film transistor" or "the channel mobility", distinguished from the mobility of the material of the active layer itself.

According to a study by the present inventors, it is difficult to increase the channel mobility of an oxide semiconductor TFT while keeping the off current low. The details will be described later.

One embodiment of the present invention provides an oxide semiconductor TFT with which it is possible to improve the ON characteristic (e.g., the channel mobility) while suppressing a decrease in the OFF characteristic.

A thin film transistor according to one embodiment of the present invention includes: a substrate; a gate electrode supported on the substrate; a gate insulating layer that covers the gate electrode; an oxide semiconductor layer provided on the gate insulating layer and having a crystalline region, the crystalline region including a first region, a second region, and a channel region located between the first region and the second region, wherein the channel region, the first region and the second region overlap with the gate electrode with the gate insulating layer interposed therebetween; a protection insulating layer arranged on the oxide semiconductor layer so that the channel region is covered and the first region and the second region are exposed; a source electrode electrically connected to the first region; and a drain electrode electrically connected to the second region, wherein a crystallinity of the channel region is different from crystallinity of the first region and the second region.

In one embodiment, the crystallinity of the channel region is lower than the crystallinity of the first region and the second region.

In one embodiment, an average grain size of the channel region is smaller than an average grain size of the first region and the second region.

In one embodiment, the channel region includes a microcrystalline oxide semiconductor; and the first region and the second region include a polycrystalline oxide semiconductor or a polycrystalline oxide conductor.

In one embodiment, the oxide semiconductor layer further includes a non-crystalline region.

A thin film transistor of another embodiment of the present invention includes: a substrate; a gate electrode supported on the substrate; a gate insulating layer that covers the gate electrode; an oxide semiconductor layer provided on the gate insulating layer, the oxide semiconductor layer including a first region, a second region, and a channel region located between the first region and the second region, wherein the channel region, the first region and the second region overlap with the gate electrode with the gate insulating layer interposed therebetween; a protection insulating layer arranged on the oxide semiconductor layer so that the channel region is covered and the first region and the second region are exposed; a source electrode electrically connected to the first region; and a drain electrode electrically connected to the second region, wherein the channel region is non-crystalline, and the first region and the second region are crystalline.

In one embodiment, a portion of the protection insulating layer is located between the oxide semiconductor layer and the source electrode, and another portion of the protection insulating layer is located between the oxide semiconductor layer and the drain electrode.

In one embodiment, the oxide semiconductor layer includes indium, gallium and zinc.

A display device according to one embodiment of the present invention includes: any of the thin film transistors set forth above; and a display region having a plurality of pixels, wherein the this: film transistor arranged in each of the pixels.

A method for manufacturing a thin film transistor according to one embodiment of the present invention includes: a step (A) of providing a substrate including a gate electrode, and a gate insulating layer that covers the gate electrode, wherein the gate electrode and the gate insulating layer are formed on a surface of the substrate; a step (B) of forming a semiconductor film made of an amorphous oxide semiconductor on the gate insulating layer; a step (C) of forming an insulating film on the semiconductor film and patterning the insulating film, thereby forming a protection insulating layer that covers a portion of the semiconductor film that is to be a channel region; a step (D) of irradiating the semiconductor film with laser light from above the protection insulating layer to crystallize a portion of the semiconductor film that is covered by the protection insulating layer and a portion thereof that is not covered by the protection insulating layer so that a crystallinity of the portion of the semiconductor film that is covered by the protection insulating layer is different from the portion thereof that is not covered by the protection insulating layer, in a region that overlaps with the gate electrode as seen from a direction normal to the substrate, those portions being crystallized so that the crystallinity of the portion of the semiconductor film that is covered by the protection insulating layer is different from the portion thereof that is not covered by the protection insulating layer; and a step (E) of forming a source electrode electrically connected to a part of the portion of the semiconductor film that is not covered by The protection insulating and a drain electrode electrically connected to another part of the portion of the semiconductor film that is not covered by the protection insulating layer.

In one embodiment, the step (D) is a step of irradiating the semiconductor film with laser light from above the protection insulating layer so as to crystallize the semiconductor film so that the crystallinity of the portion of the semiconductor film that is covered by the protection insulating layer is lower than the crystallinity of the portion thereof that is not covered by the protection insulating layer, in the region that overlaps with the gate electrode as seen from the direction normal to the substrate.

A method for manufacturing a thin film transistor according to another embodiment of the present invention includes: a step (A) of providing a substrate including a gate electrode, and a gate insulating layer that covers the gate electrode, wherein the gate electrode and the gate insulating layer are formed on a surface of the substrate; a step (B) of forming a semiconductor film made of an amorphous oxide semiconductor on the gate insulating layer; a step (C) of forming an insulating film on the semiconductor film and patterning the insulating film, thereby forming a protection insulating layer that covers a portion of the semiconductor film that is to be a channel region; a step (D) of irradiating the semiconductor film with laser light from above the protection insulating layer so as to crystallize the semiconductor film so that in a region that overlaps with the gate electrode as seen from a direction normal to the substrate, a portion of the semiconductor film that is not covered by the protection insulating layer is crystallized while a portion thereof that is covered by the protection insulating layer is left to remain non-crystalline; and a step (E) of forming a source electrode electrically connected to a part of the portion of the semiconductor film that is not covered by the protection insulating layer, and a drain electrode electrically connected to another part of the portion of the semiconductor film that is not covered by the protection insulating layer.

In one embodiment, a wavelength of the laser light is about 248 nm, and the protection insulating layer is a silicon oxide layer.

In one embodiment, in the step (D), only a portion of the semiconductor film is irradiated with the laser light so that a portion of the semiconductor film that is not irradiated with the laser light is left to remain non-crystalline.

One embodiment of the present invention provides an oxide semiconductor TFT with which it is possible to improve the ON characteristic while suppressing a decrease in the OFF characteristic.

DETAILED DESCRIPTION

Figure 1:
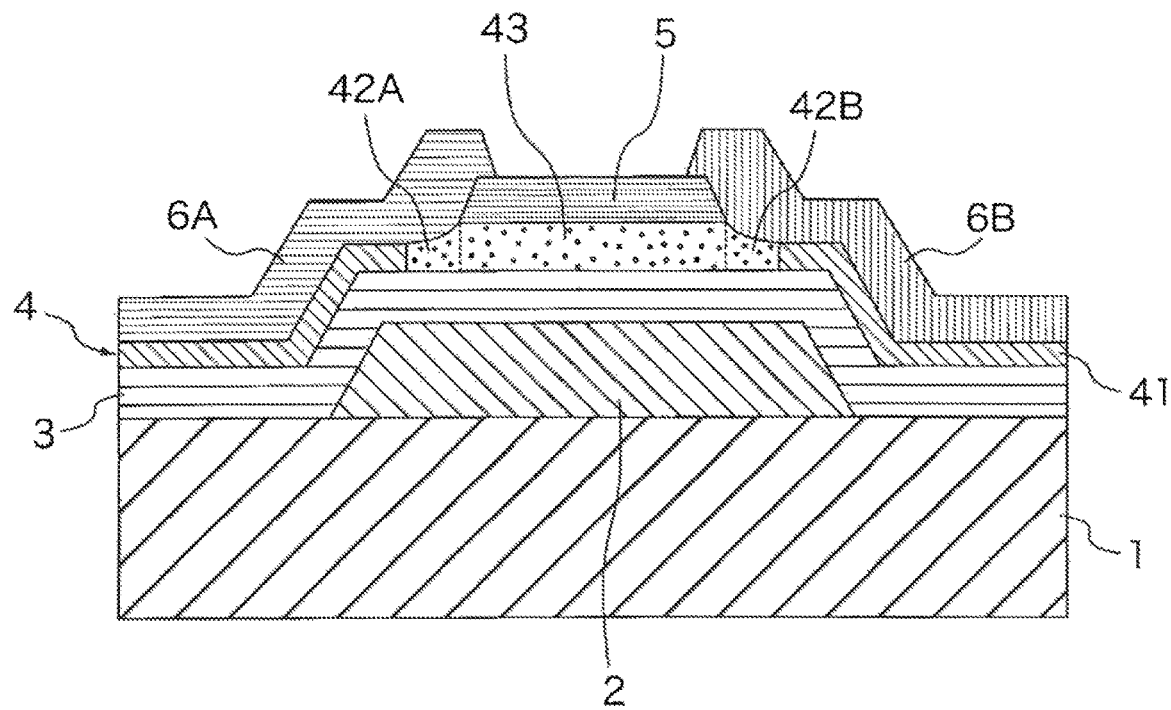
FIG. 1 is a schematic cross-sectional view illustrating the structure of a thin film transistor according to Embodiment 1.

Techniques are known in the art for crystallizing an oxide semiconductor film by heating the oxide semiconductor film at a predetermined temperature.

The present inventors studied a (laser anneal) method for crystallizing an amorphous oxide semiconductor film through laser light irradiation for the purpose of improving the ON characteristic of the oxide semiconductor TFT by increasing the light tolerance and the mobility of the oxide semiconductor film. As a result of the study, the present inventors found the following.

When an oxide semiconductor film is crystallized by laser anneal, the oxygen deficiency in the film may increase, thereby lowering the resistance. When a TFT is formed using such an oxide semiconductor film, the off current may increase, and the switching characteristic as a transistor may no longer be realized. Therefore, crystallization preferably performed under such conditions that it is possible to improve the mobility while suppressing a decrease in the electric resistance of the oxide semiconductor film, particularly a portion thereof that is to be the channel region.

On the other hand, it is preferred to crystallize to lower the resistance (or make conductive) a portion of the oxide semiconductor film that is to be the contact region to be electrically connected to the source electrode or the drain electrode. Since it is possible to reduce the on resistance of the oxide semiconductor TFT by reducing the electric resistance of the contact region, it is possible to further increase the ON characteristic.

In view of this, the present inventors found that with an oxide semiconductor TFT having an etch stop structure, by laser-annealing the oxide semiconductor film using the etch stop layer, it is possible to vary the crystallinity between a portion of the oxide semiconductor film that is to be the channel region and a portion of the oxide semiconductor film that is to be the contact region, arriving at the invention of the present application. According to an embodiment of the invention of the present application, it is possible to individually control the crystallinity of the channel region and the crystallinity of the contact region, and it therefore possible to provide an oxide semiconductor TFT that is capable of realizing both a good OFF characteristic and a good ON characteristic.

Note that Japanese Laid-Open Patent Publication No. 2012-253752, for example, describes a method for crystallizing the oxide semiconductor film by a heat treatment. With this method, however, the entire oxide semiconductor film is crystallized under generally the same conditions, and it is difficult to optimize the crystallinity of the channel region and the crystallinity of the contact region.

Japanese Laid-Open Patent Publication No. 2014-140005 discloses a method for irradiating an oxide semiconductor film with laser light from the reverse surface of the substrate using gate electrodes as a mask, thereby crystallizing only portions of the oxide semiconductor film that do not overlap with gate electrodes. Each crystallized portion functions as a contact region to be connected to the source electrode or the drain electrode. With this method, it is not possible to crystallize the channel region, and it is therefore possible to increase the channel mobility. Moreover, since a gate electrode that can function as a light blocking film cannot be placed on the substrate side of the contact region, the characteristic may lower due to light.

An embodiment of the present invention will be described in detail with reference to the drawings.

Embodiment 1

Figure 2:
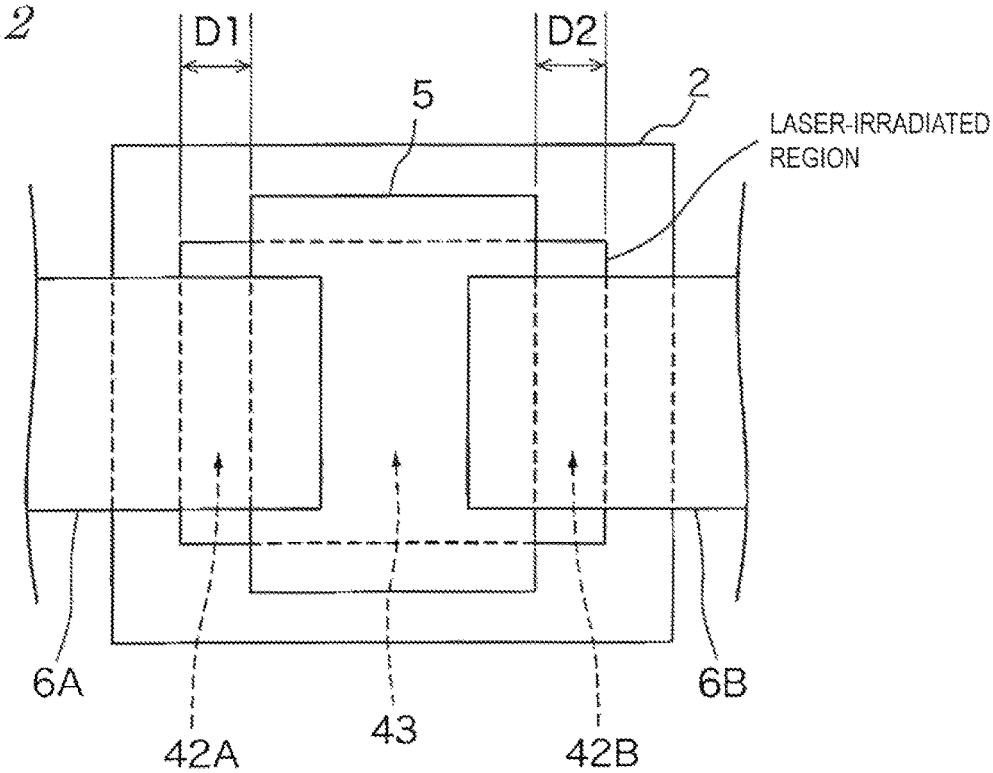
FIG. 2 is a schematic plan view illustrating the structure of the thin film transistor according to Embodiment 1.

FIG. 1 is a schematic cross-sectional view illustrating the structure of a thin film transistor according to Embodiment 1, and FIG. 2 is a schematic plan view thereof. The thin film transistor according to Embodiment 1 includes a gate electrode 2, a gate insulating layer 3, a semiconductor layer 4, an etch stop film (protection insulating layer) 5, a source electrode and a drain electrode 6B, for example. Herein, the semiconductor layer 4 is an oxide semiconductor layer including an oxide that includes indium, gallium and zinc (an In-Ga-Zn-O-based oxide), for example. Note that for the sake of simplicity, the plan view of FIG. 2 only shows the positional relationship between the gate electrode 2, polycrystalline oxide semiconductor regions 42A and 42B of the semiconductor layer 4 and a microcrystalline oxide semiconductor region 43, and the etch stop film 5, while not showing other components of the thin film transistor.

The gate electrode 2 is an electrode patterned on the surface of the substrate 1, and can be formed by using a material, for example, a metal such as Al, Mg, Mo, Cr, Ta, Cu, Ti, Ni, W or Mn, an alloy having one or more of these metals as its primary component, or a metal oxide thereof. Herein, an insulative substrate such as a glass substrate, for example, is used as the substrate 1.

The gate insulating layer 3 is formed so as to cover the gate electrode 2 on the substrate 1. The gate insulating layer 3 may be an insulating film of an organic substance, or may be an insulating film of an inorganic substance. As to an insulating film of an organic substance, TEOS (tetraethyl orthosilicate) may be used, for example. As to an insulating film of an inorganic substance, $SiO_2$, $SiO_2$/SiN, SiN, SiON, $Al_2O_3$, $HfO_2$, or the like, may be used.

The semiconductor layer 4 includes an amorphous oxide semiconductor region 41, the polycrystalline oxide semiconductor regions 42A and 42B, and the microcrystalline oxide semiconductor region 43. The amorphous oxide semiconductor region 41 is formed on the upper side (the opposite side from the substrate) of the gate insulating layer 3, and has a thickness of 25 nm or more, for example. The polycrystalline oxide semiconductor regions 42A and 42B and the microcrystalline oxide semiconductor region 43 are formed on the upper side of the gate insulating layer 3, as is the amorphous oxide semiconductor region 41, and are present in the same layer as the amorphous oxide semiconductor region 41. Note that the polycrystalline oxide semiconductor regions 42A and 42B are low-resistance regions having a lower resistance than the microcrystalline oxide semiconductor region 43 and the amorphous oxide semiconductor region 41. These regions 42A and 42B may be polycrystalline oxide conductor regions.

In the present embodiment, the polycrystalline oxide semiconductor regions 42A and 42B and the microcrystalline oxide semiconductor region 43 are formed inside a region (which is a rectangular region in the example shown in FIG. 2 and will be referred to as the "gate region") that is delimited by the outer edge of the gate electrode 2 as seen from above. In the present embodiment, a region of the semiconductor layer 4 that is covered by the etch stop film 5 is the microcrystalline oxide semiconductor region 43, and regions that are located on the opposite sides with respect to the microcrystalline oxide semiconductor region 43 are the polycrystalline oxide semiconductor regions 42A and 42B. That is, in the present embodiment, the crystallinity of the region of the semiconductor layer 4 that is covered by the etch stop film 5 is lower than the crystallinity of the two regions on the outer side. Herein, the widths D1 and D2 of the regions 42A and 42B that are located on the opposite sides with respect to the microcrystalline oxide semiconductor region 43 and that are not covered by the etch stop film 5 are each preferably 3 μm or more.

Note that the crystallinity of the semiconductor layer 4 can be determined by, for example, observing the cross-sectional shape using a transmission electron microscope (TEM). For example, a diffraction image taken by a transmission electron microscope can be determined to be non-crystalline (amorphous) if it has no ring-shaped diffraction pattern but only has a blur halo pattern, or if it only has a single ring-shaped diffraction pattern in a halo pattern. A diffraction image taken by a transmission electron microscope that is observed to have two or more ring-shaped diffraction patterns (Debye-Scherrer rings) can be determined to be polycrystalline if the number of Debye-Scherrer rings observed is high and to be microcrystal if the number is low.

The crystallinity of the semiconductor layer 4 may be determined by observing the shape of the crystal grains using an electron micrograph. The size of crystal grains in a microcrystal is 1 nm or more and 1 μm or less, e.g., 1 nm or more and 15 nm or less. On the other hand, the size of crystal grains in a polycrystal may be 15 nm or more 10 μm or less.

An island-like etch stop film 5 is formed on the upper side of the microcrystalline oxide semiconductor region 43. The etch stop film 5 can be formed by using a material such as $SiO_2$, for example. In the present embodiment, the etch stop film 5 is formed so as to be located above the gate electrode 2 and so as to cover a partial region of the semiconductor layer 4 (a region where the microcrystalline oxide semiconductor region 43 is formed) inside the gate region.

The source electrode 6A and the drain electrode 6B each having predetermined pattern are formed spaced apart from each other on the upper side of the semiconductor layer 4. The source electrode 6A and the drain electrode 6B are formed by using a material such as a metal such as Al, Mg, Mo, Cr, Ta, Cu, Ti, Ni, W or Mn, an alloy having one or more of these metals as its primary component, or a metal oxide thereof, for example. In the present embodiment, the source electrode 6A is formed over one polycrystalline oxide semiconductor region 42A that is not covered by the etch stop film 5, and the drain electrode 6B is formed over the other polycrystalline oxide semiconductor region 42B that is not covered by the etch stop film 5.

FIG. 3A to FIG. 3D are schematic cross-sectional views illustrating a method for manufacturing a thin film transistor according to Embodiment 1. First, a metal film made of a material such as a metal such as Al, Mg, Mo, Cr, Ta, Cu, Ti, Ni, W or Mn, an alloy having one or more of these metals as its primary component, or a metal oxide thereof, for example, is deposited by a sputtering method on the surface of an insulative substrate 1 such as a glass substrate, and is patterned into the gate electrode 2 through photolithography using a photomask, dry etching of the metal film, resist removal and cleaning.

Then, a film is deposited by a CVD (Chemical Vapor Deposition) method using a material such as $SiO_2$ or SiN, for example, thereby forming the gate insulating layer 3 so as to cover the gate electrode 2 on the substrate 1. The gate insulating layer 3 may a layered film of materials such as $SiO_2$ and SiN, for example.

Then, a film is deposited under an environment with a temperature that is less than or equal to a temperature such that the oxide semiconductor has a low resistance using a sputtering method, thereby forming an amorphous oxide semiconductor film (e.g., an amorphous In-Ga-Zn-O-based semiconductor film) (thickness: 20 nm to 200 nm, for example) on the gate insulating layer 3. Note that the oxide semiconductor film may be formed using other deposition methods such as a pulsed laser deposition method, an electron beam deposition method and a coating deposition, instead of a sputtering method.

Figure 3A:
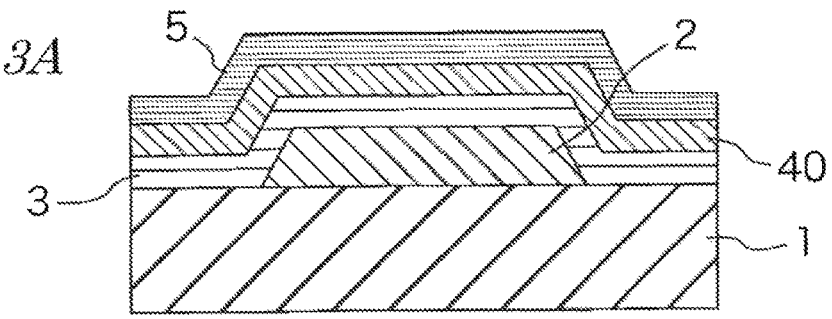
FIG. 3A is a schematic cross-sectional view illustrating a method for manufacturing the thin film transistor according to Embodiment 1.

Then, an $SiO_2$ film having a thickness of about 10 to 200 nm is deposited using a CVD method, thereby forming the etch stop film 5 on the amorphous oxide semiconductor film 40. FIG. 3A shows a state where the gate electrode 2, the gate insulating layer 3, the amorphous oxide semiconductor film 40 and the etch stop film 5 have been formed on the surface of the substrate 1.

Figure 3B:
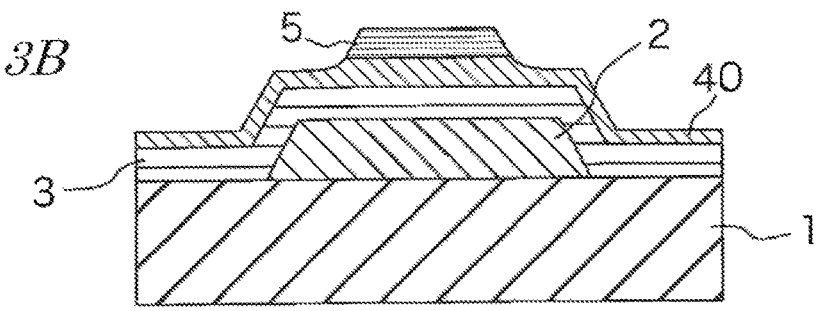
FIG. 3B is a schematic cross-sectional view illustrating a method for manufacturing the thin film transistor according to Embodiment 1.

Then, the etch stop film 5 is formed in an island-like pattern through photolithography using a photomask, dry etching of the etch stop film 5, resist removal and cleaning. At this point, the amorphous oxide semiconductor film 40 includes a region that is covered by the etch stop film 5, and a region that is not covered by the etch stop film 5. The thickness of the region that is covered by the etch stop film 5 may be greater than the thickness of the region that is not covered by the etch stop film 5, and may be 25 nm or more, for example. FIG. 3B shows a state where the island-like etch stop film has been formed on the amorphous oxide semiconductor film 40.

Then, laser light (energy beam) is projected from above the etch stop film 5 onto a region that is inside the gate region and that is larger than the region delimited by the outer edge of the etch stop film 5, as seen from above, thereby annealing the amorphous oxide semiconductor film 40. The laser light used in the annealing treatment may be an excimer laser using a mixed gas such as XeF, KrF or XeCl having a wavelength of 200 to 400 nm, or a solid laser such as YAG (Yttrium Aluminum Garnet) or triple wave. The laser light absorption rate of the amorphous oxide semiconductor film 40 varies depending on the thickness of the etch stop film 5. In the present embodiment, the thickness of the etch stop film 5 is determined as follows.

Figure 4:
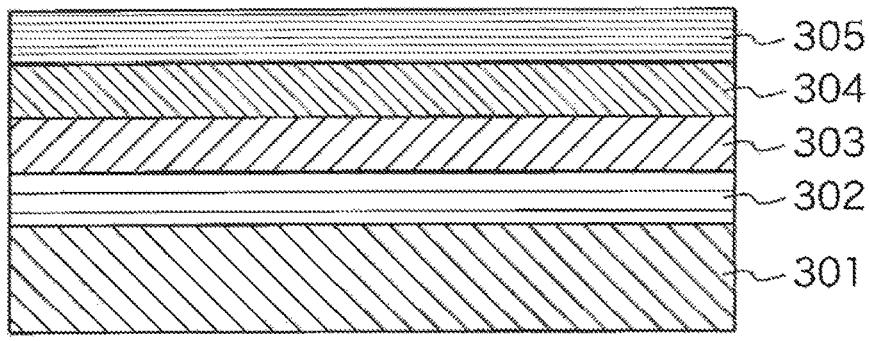
FIG. 4 is a schematic cross-sectional view showing a film structure model that is used when calculating the laser light absorption rate.
Figure 5:
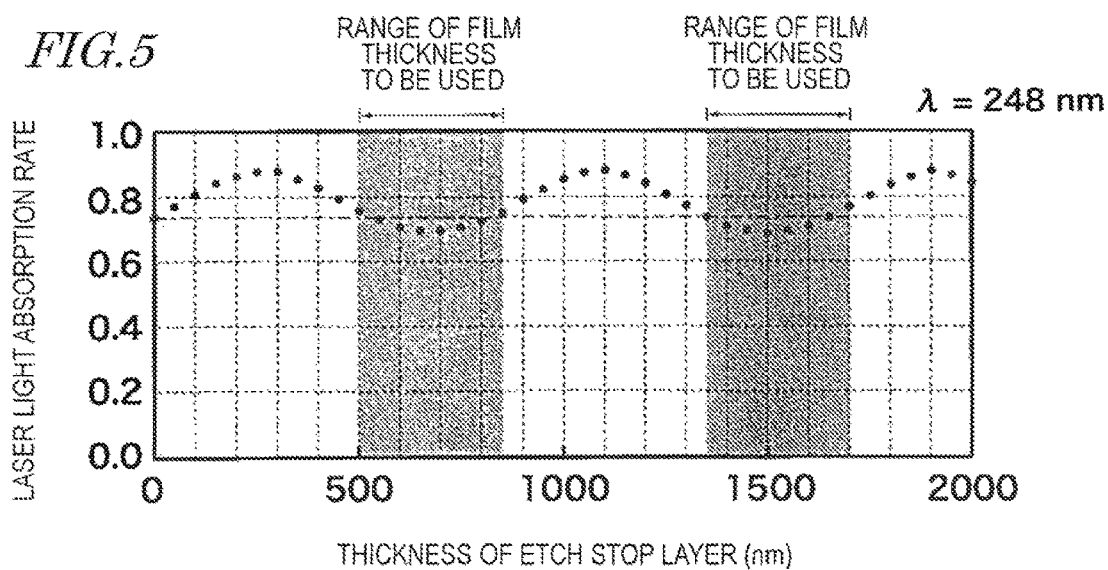
FIG. 5 is a graph showing the results of the calculation of the laser light absorption rate.

FIG. 4 is a schematic cross-sectional view showing a film structure model that is used when calculating the laser light absorption rate, and FIG. 5 is a graph showing the results of the calculation of the laser light absorption rate. The present embodiment employed a film structure model of a multi-layer structure including five layers, i.e., a gate electrode 301, gate insulating layers 302 and 303, an amorphous In-Ga-Zn-O-based semiconductor layer 304 and an etch stop layer 305, wherein the laser light absorption rate of the amorphous In-Ga-Zn-O-based semiconductor layer was calculated taking into consideration the amplitude reflectivity and the amplitude transmittance at the interfaces between the films.

Note that the wavelength of the laser light used for the calculation was set to 248 nm. The gate electrode 301 was an Mo film (thickness: undefined) having a refractive index for the laser light of 1.46 and an extinction coefficient of 3.62. The gate insulating layer 302 was an SiN film (thickness: fixed) having a refractive index for the laser light of 2.28 and an extinction coefficient of 0, and the gate insulating layer 303 was an $SiO_2$ film (thickness: fixed) having a refractive index of 1.51 and an extinction coefficient of 0. The amorphous In-Ga-Zn-O-based semiconductor layer 304 was an amorphous In-Ga-Zn-O-based semiconductor film (thickness: fixed) having refractive index of 2.3 and an extinction coefficient of 0.5. The etch stop layer 305 was a silicon oxide ($SiO_2$) film (thickness: variable) having a refractive index of 1.51 and an extinction coefficient of 0.

The laser light absorption rate of the amorphous In-Ga-Zn-O-based semiconductor layer 304 was calculated while varying the thickness of the etch stop layer 305, while taking into consideration the multiple interference that occurs when laser light having a wavelength of 248 nm is incident from a direction vertical to the surface of the film structure model.

The graph shown in FIG. 5 shows the results of the calculation of the laser light absorption rate of the amorphous In-Ga-Zn-O-based semiconductor layer 304 obtained while varying the thickness of the etch stop layer 305. The horizontal axis of the graph represents the thickness (nm) of the etch stop layer 305, and the vertical axis represents the laser light absorption rate of the amorphous In-Ga-Zn-O-based semiconductor layer 304. From the calculation results shown in FIG. 5, it can be seen that the laser light absorption rate of the amorphous In-Ga-Zn-O-based semiconductor layer 304 (corresponding to the amorphous oxide semiconductor film 40) changes periodically over the range from about 0.7 (local minimum) to about 0.9 (local maximum) with respect to the thickness of the etch stop layer 305 (corresponding to the etch stop film 5).

In the present embodiment, the thickness of the etch stop film 5 is determined with reference to the calculation results of FIG. 5. Specifically, the thickness is determined so that the laser light absorption rate of the amorphous oxide semiconductor film 40 takes the local minimum or a value in the vicinity of the local minimum value within a predetermined range including the local minimum).

For example, in the present embodiment, the thickness of the etch stop film 5 is determined to be in the range of 50 to 85 nm (or 135 to 170 nm) so that the laser light absorption rate of the amorphous oxide semiconductor film 40 takes a value within a predetermined range including the local minimum, and the etch stop film 5 is deposited to the determined thickness. Then, the etch stop film 5 is formed in an island-like pattern through dry etching, resist removal and cleaning, and is irradiated with laser light (an excimer laser or a solid laser) having the wavelength described above, thus annealing the amorphous oxide semiconductor film 40.

With the thickness of the etch stop film 5 in the range of 50 to 85 nm (or 135 to 170 nm) the laser light absorption rate of the amorphous oxide semiconductor film 40 takes a value in the vicinity of the local minimum or the local minimum, the laser light absorption rate being lower than that when the etch stop film 5 is absent (the thickness is 0). Thus, the laser light absorption rate of the region of the amorphous oxide semiconductor film 40 that is covered by the etch stop film 5 is lower than that of the region that is not covered by the etch stop film 5. As a result, the region of the amorphous oxide semiconductor film 40 that is covered by the stop film 5 becomes a region including a microcrystalline oxide semiconductor, for example, and the region that is not covered by the etch stop film 5 becomes a region including a polycrystalline oxide semiconductor, for example.

Note that the laser light absorption rate of the region of the amorphous oxide semiconductor film 40 that is covered by the etch stop film 5 may be generally equal to that of the region that is not covered by the etch stop film 5. In such a case, these regions, in principle, generate generally the same amount of thermal energy due to laser light absorption. However, in the region that is covered by the etch stop film 5, heat is absorbed by the etch stop film 5, thereby reducing the thermal energy for the crystallization of the amorphous oxide semiconductor, resulting in the crystallinity of the region that is covered by the etch stop film 5 being lower than the crystallinity of the region that is not covered the etch stop film 5. As a result, for example, the region of the amorphous oxide semiconductor film 40 that is covered by the etch stop film 5 becomes a region including a microcrystalline oxide semiconductor, and the region that is not covered by the etch stop film 5 becomes a region including a polycrystalline oxide semiconductor.

Figure 3C:
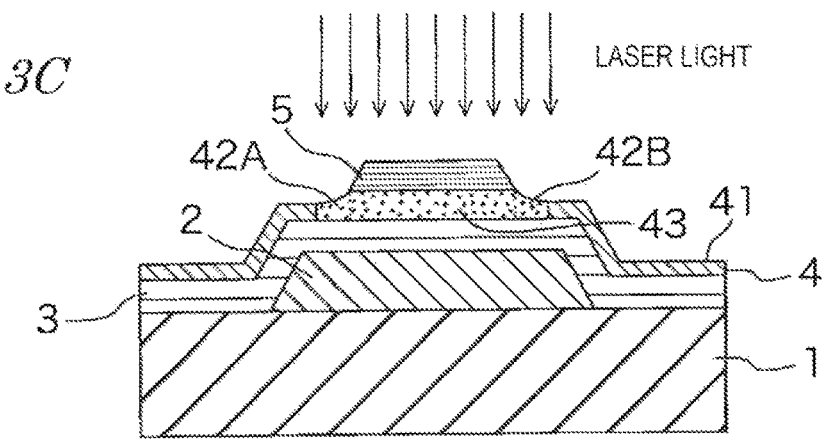
FIG. 3C is a schematic cross-sectional view illustrating a method for manufacturing the thin film transistor according to Embodiment 1.

By annealing the amorphous oxide semiconductor film 40 using the laser light described above from above the etch stop film 5, the microcrystalline oxide semiconductor region 43 is formed in the region of the amorphous oxide semiconductor film 40 that is covered by the etch stop film 5, and the polycrystalline oxide semiconductor regions 42A and 42B is formed in regions that are located on the opposite sides of the microcrystalline oxide semiconductor region 43 and are not covered by the etch stop film 5. Regions of the amorphous oxide semiconductor film 40 that are not irradiated with laser light are left to remain non-crystalline (the amorphous oxide semiconductor region 41). FIG. 3C shows a state where the semiconductor layer 4 including the amorphous oxide semiconductor region 41, the polycrystalline oxide semiconductor regions 42A and 42B and the microcrystalline oxide semiconductor region 43 has been formed by the annealing treatment using laser light.

Figure 3D:
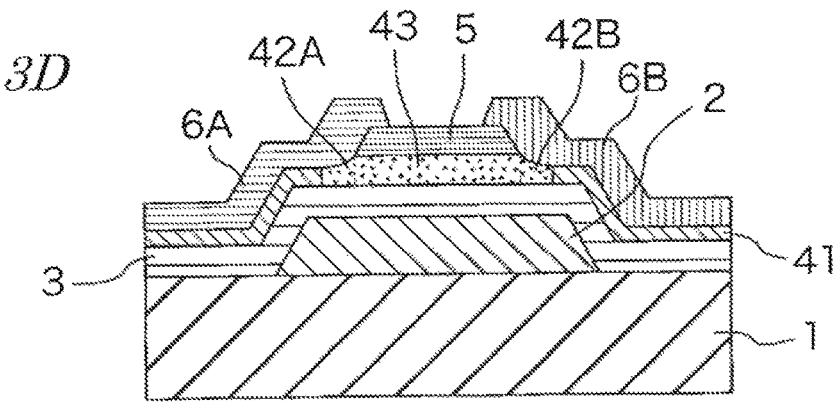
FIG. 3D is a schematic cross-sectional view illustrating a method for manufacturing the thin film transistor according to Embodiment 1.

Then, a metal film made of a material such as a metal such as Al, Mg, Mo, Cr, Ta, Cu, Ti, Ni, W or Mn, an alloy having one or more of these metals as its primary component, or a metal oxide thereof, for example, is deposited by a sputtering method, and the source electrode 6A and the drain electrode 6B are patterned on the semiconductor layer 4 through photolithography using a photomask, dry etching of a metal film, resist removal and cleaning. In this process, the photolithography using a photomask and the dry etching of the metal film are performed so that the source electrode 6A and the drain electrode 6B are separated from each other over the etch stop film 5, and so that a portion of the source electrode 6A is located above the polycrystalline oxide semiconductor region 42A and a portion of the drain electrode 6B is located above the polycrystalline oxide semiconductor region 42B. FIG. 3D shows a state where the source electrode 6A and the drain electrode 6B have been formed.

Next, the electric characteristics of the thin film transistor of the present embodiment will be described.

Figure 6:
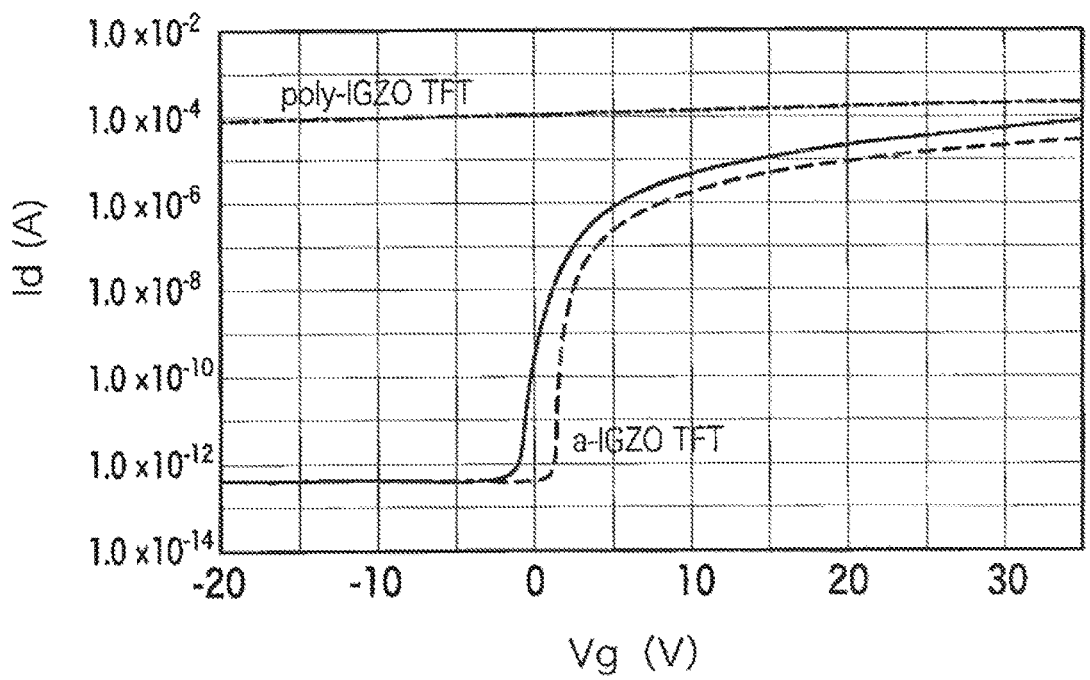
FIG. 6 is a graph showing the Vg-Id characteristic of the thin film transistor according to the present embodiment.

FIG. 6 is a graph showing the Vg-Id characteristic of the thin film transistor according to the present embodiment. The horizontal axis of the graph represents the gate voltage Vg (V), and the vertical axis represents the drain current Id (A). Note that the value of the drain voltage Vd was set to 10 V. In FIG. 6, the solid line represents the Vg-Id characteristic of the thin film transistor according to the present embodiment, the broken line represents the Vg-Id characteristic of a thin film transistor of the first reference example where the channel portion is formed by the amorphous oxide semiconductor region (amorphous In-Ga-Zn-O-based semiconductor region), and the one-dot-chain line represents the Vg-Id characteristic of a thin film transistor of the second reference example where the channel portion is formed only by the polycrystalline oxide semiconductor region (polycrystalline In-Ga-Zn-O-based semiconductor region).

Note that the method for manufacturing the thin film transistor of the second reference example is similar to the method described above with reference to FIG. 3A to FIG. 3D. Note however that it is different from the method shown in FIG. 3A to FIG. 3D in that laser light is projected onto the amorphous oxide semiconductor film from above the insulating film after forming an insulating film to be the etch stop layer on the amorphous oxide semiconductor film and before patterning the insulating film. Thus, the entirety of the region of the amorphous oxide semiconductor film that is irradiated with laser light is crystallized under substantially the same condition to become the polycrystalline oxide semiconductor region. Then, the insulating film is patterned so as to form the etch stop layer that covers a portion of the polycrystalline oxide semiconductor region. Therefore, with the thin film transistor of the second reference example, the region of the semiconductor layer that is covered by the etch stop layer and the regions that are connected to the source and drain electrodes have a generally equal crystallinity.

The following electric characteristics are observed from the graph shown in FIG. 6.

(1) The mobility was 8.83 cm$^2$/Vs for the first reference example, and was 18.17 cm$^2$/Vs for the thin film transistor according to the present embodiment.

(2) The sub-threshold coefficient was 0.44 V/dec both for the first reference example and for the thin film transistors according to the present embodiment.

(3) The threshold voltage was 3.62 V for the first reference example, and was 2.61 V for the thin film transistor according to the present embodiment.

(4) With the gate voltage being −15 V, the off current was 4.64×10$^{-13}$ A for the first reference example, and was 4.90×10$^{-13}$ A for the thin film transistor according to the present embodiment.

(5) With the second reference example, a current similar to the on current was conducted even in the region where the gate voltage was negative. That is, it did not perform the switching operation as a TFT.

From the results described above, the thin film transistor of the present embodiment has a higher mobility (channel mobility) than the thin film transistor of the first reference example. It was also found that the off current of the thin film transistor of the present embodiment is kept as low as that of the thin film transistor of the first reference example.

As described above, in the present embodiment, contact regions of the semiconductor layer 4 that are connected to (in direct contact with) the source electrode 6A and the drain electrode 6B are formed by the low-resistance polycrystalline oxide semiconductor regions 42A and 42B, while the channel region is formed by the microcrystalline oxide semiconductor region 43 to maintain the resistance, thereby making it possible to improve the mobility and the switching operation while suppressing an increase in the off current.

Next, variations regarding the positional relationship between the gate electrode 2, the crystalline region (i.e., the laser-irradiated region) of the semiconductor layer 4 and the etch stop film 5 will be described.

Variation 1

Figure 7:
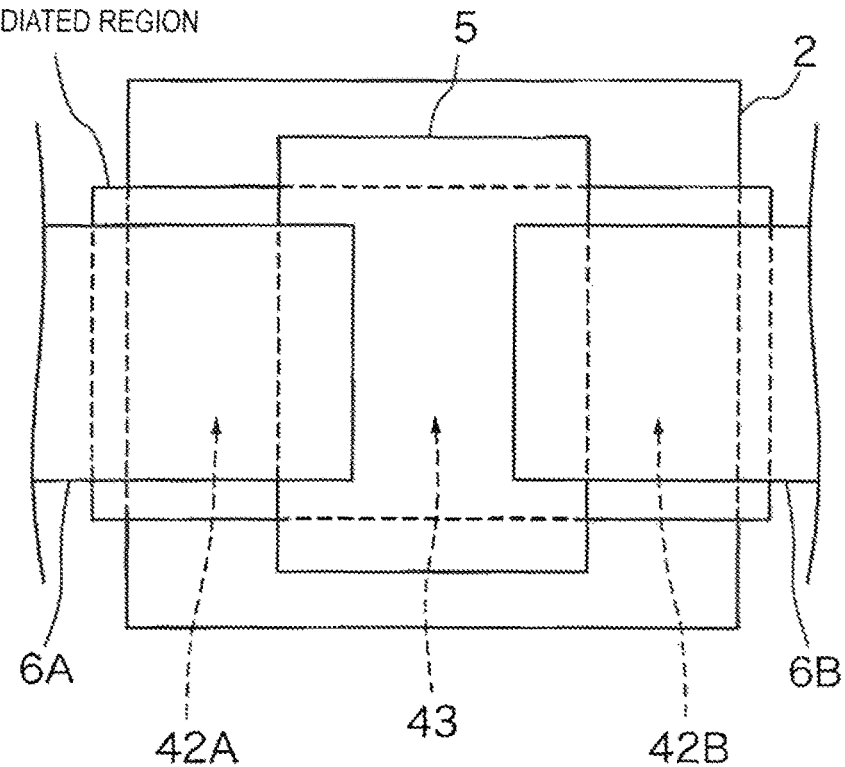
FIG. 7 is a schematic plan view of a thin film transistor according to Variation 1.

FIG. 7 is a schematic plan view of a thin film transistor according to Variation 1. In Variation 1, the crystalline region (i.e., the laser-irradiated region) extends beyond the gate region. Such a configuration is realized by expanding the laser light-irradiated region into the outside of the gate region in the annealing treatment for the amorphous oxide semiconductor film 40.

Variation 2

Figure 8:
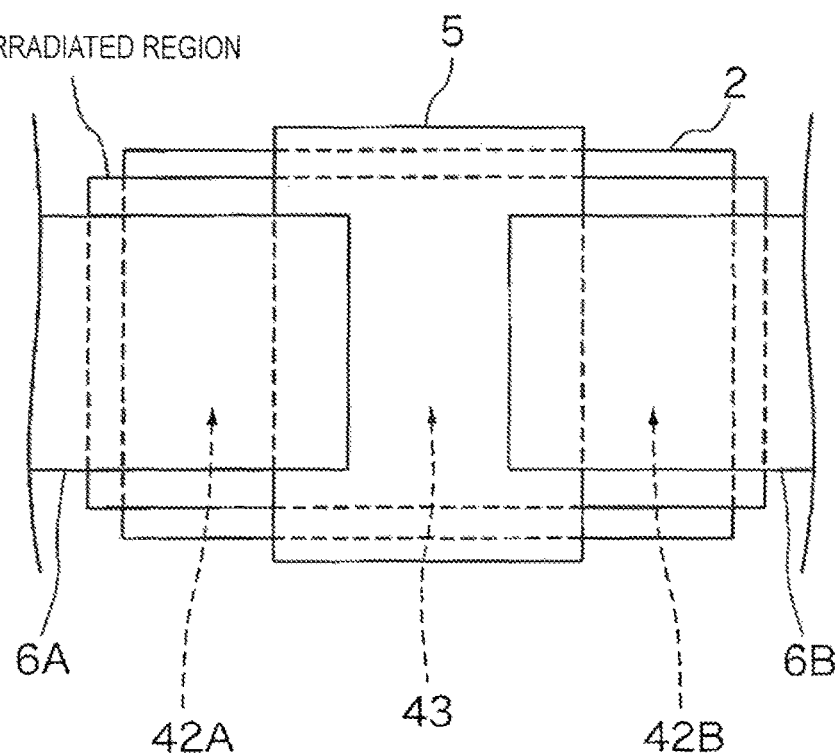
FIG. 8 is a schematic plan view of a thin film transistor according to Variation 2.

FIG. 8 is a schematic plan view of a thin film transistor according to Variation 2. In Variation 2, the crystalline region (i.e., the laser-irradiated region) extends beyond the gate region, and the etch stop film 5 has portions thereof lying outside the gate region. Such a configuration is realized by expanding the range of the photomask into the outside of the gate region when etching the etch stop film 5 so as to leave portions thereof outside the gate region unetched. It is realized also by expanding the laser light-irradiated region into the outside of the gate region in the annealing treatment for the amorphous oxide semiconductor film 40.

Variation 3

Figure 9:
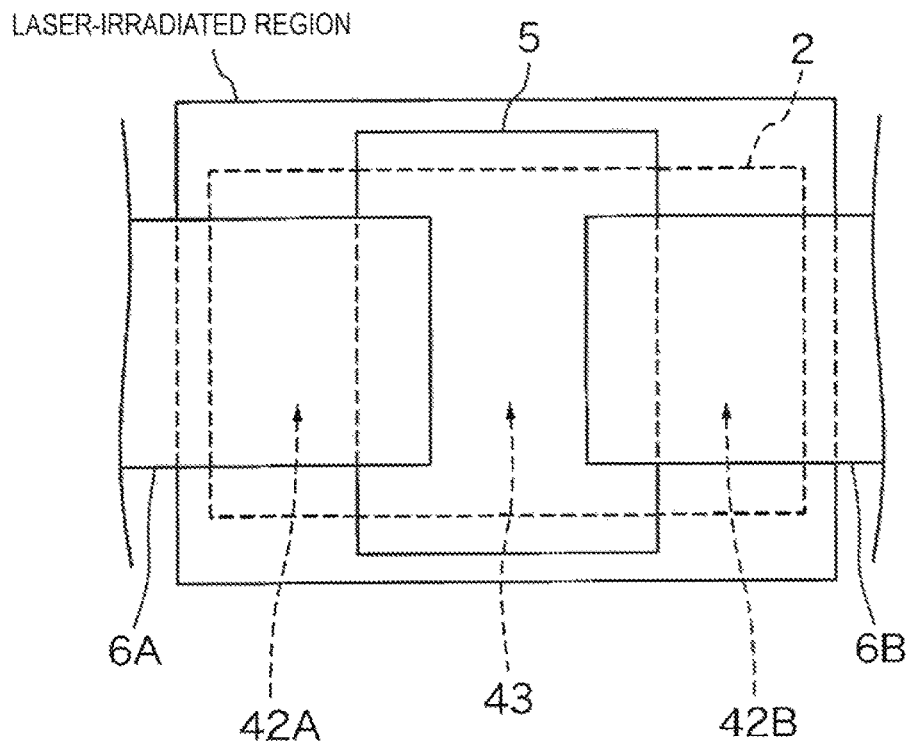
FIG. 9 is a schematic plan view of a thin film transistor according to Variation 3.

FIG. 9 is a schematic plan view of a thin film transistor according to Variation 3. In Variation 3, the etch stop film 5 has portions thereof lying outside the gate region, and the crystalline region (i.e., the laser-irradiated region) extends outside a region that is delimited by the gate region and the outer edge of the etch stop film 5. Such a configuration is realized by expanding the range of the photomask into the outside of the gate region when etching the etch stop film 5 so as to leave portions thereof outside the gate region unetched. It is realized also by expanding the laser light-irradiated region into the outside of a region that is delimited by the gate region and the outer edge of the etch stop film 5 in the annealing treatment for the amorphous oxide semiconductor film 40.

Variation 4

Figure 10:
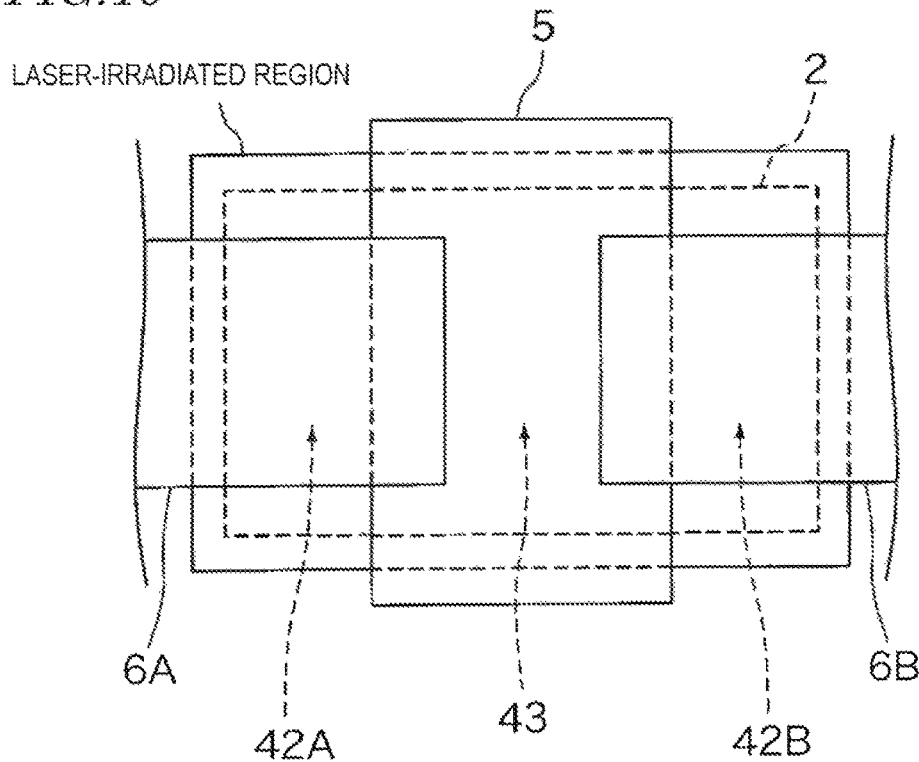
FIG. 10 is a schematic plan view of a thin film transistor according to Variation 4.

FIG. 10 is a schematic plan view of a thin film transistor according to Variation 4. In Variation 4, the crystalline region (i.e., the laser-irradiated region) extends beyond the gate region, and the etch stop film 5 has portions thereof lying outside the gate region and the crystalline region (i.e., the laser-irradiated region). Such a configuration is realized by expanding the range of the photomask into the outside of the gate region and the crystalline region (i.e., the laser-irradiated region) when etching the etch stop film 5 so as to leave portions thereof outside the gate region and the crystalline region (i.e., the laser-irradiated region) unetched. It is realized also by expanding the laser light-irradiated region into the outside of the gate region in the annealing treatment for the amorphous oxide semiconductor film 40.

Variation 5

Figure 11:
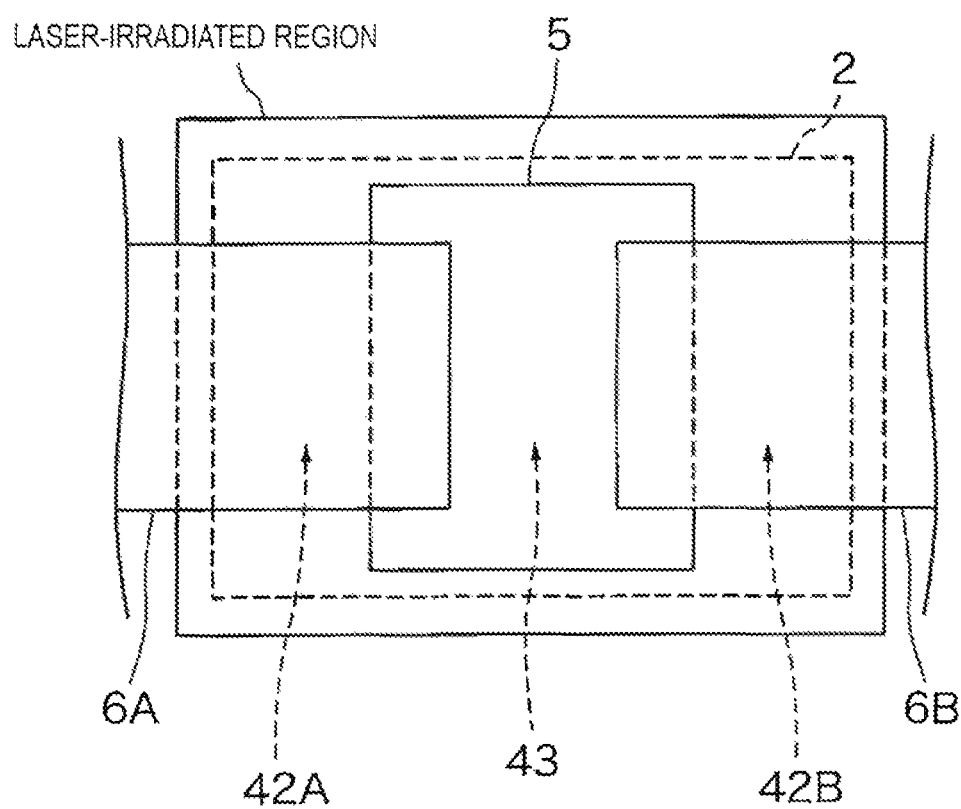
FIG. 11 is a schematic plan view of a thin film transistor according to Variation 5.

FIG. 11 is a schematic plan view of a thin film transistor according to Variation 5. In Variation 5, the crystalline region (i.e., the laser-irradiated region) extends beyond the gate region, and the etch stop film 5 is formed in a region that is inside the gate region in the annealing treatment for the amorphous oxide semiconductor film 40. Such a configuration is realized by restricting the range of the photomask inside the gate region when etching the etch stop film 5. It is realized also by expanding the laser light-irradiated region into the outside of the gate region in the annealing treatment for the amorphous oxide semiconductor film 40.

Embodiment 2

Embodiment 2 is directed to a configuration of a display device using a thin film transistor according to the present embodiment.

Figure 12:
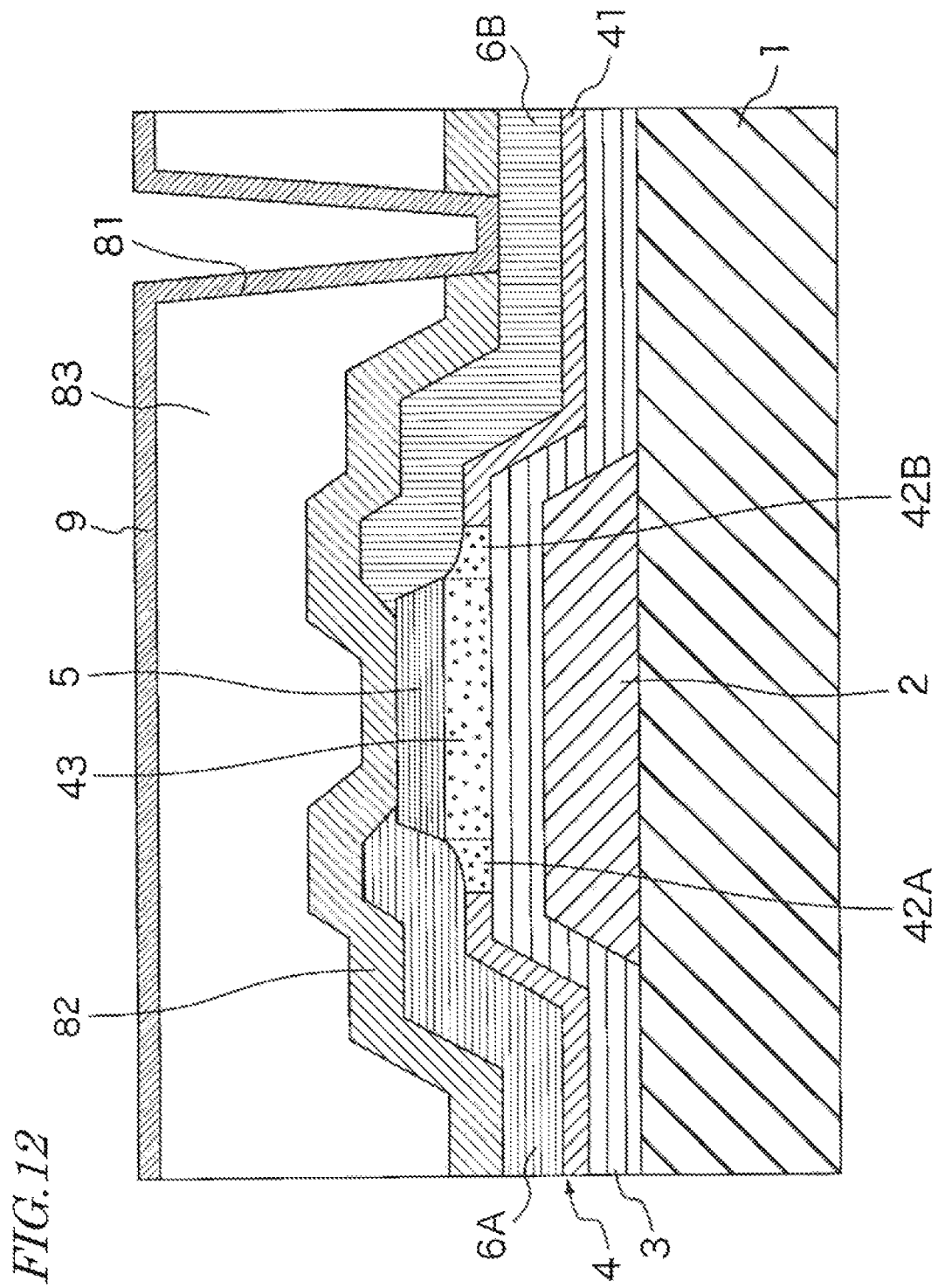
FIG. 12 is a schematic cross-sectional view illustrating the structure of a thin film transistor according to Embodiment 2.

When the thin film transistor of Embodiment 2 is used as a switching element of a liquid crystal display device, a passivation film 82, an organic film 83 and a pixel electrode 9 are formed in this order on the source electrode 6A and the drain electrode 6B (see FIG. 12).

FIG. 12 is a schematic cross-sectional view illustrating the configuration of the thin film transistor according to Embodiment 2. The thin film transistor according to Embodiment 2 includes the gate electrode 2, the gate insulating layer 3, the semiconductor layer 4, the etch stop film 5, the source electrode 6A and the drain electrode 6B, the passivation film 82, the organic film 83 and the pixel electrode 9, for example. Note that the configuration of the gate electrode 2, the gate insulating layer 3, the semiconductor layer 4, the etch stop film 5, the source electrode 6A and the drain electrode 6B is similar to that of Embodiment 1.

The passivation film 82 is formed on the source electrode 6A and the drain electrode 6B by a CVD method using SiN, or the like, for example. The organic film 83 of an acrylic resin, or the like, is formed on the passivation film 82. Then, it is patterned through photolithography, etching, resist removal and cleaning, thereby providing a contact hole 81 reaching the drain electrode 6B. An ITO (Indium Tin Oxide) film is formed by a sputtering method on the organic film 83 and is patterned, thereby forming the pixel electrode 9. Note that an SOG (Spin-on Glass) film, instead of an acrylic resin, may be used for the organic film 83.

Figure 13:
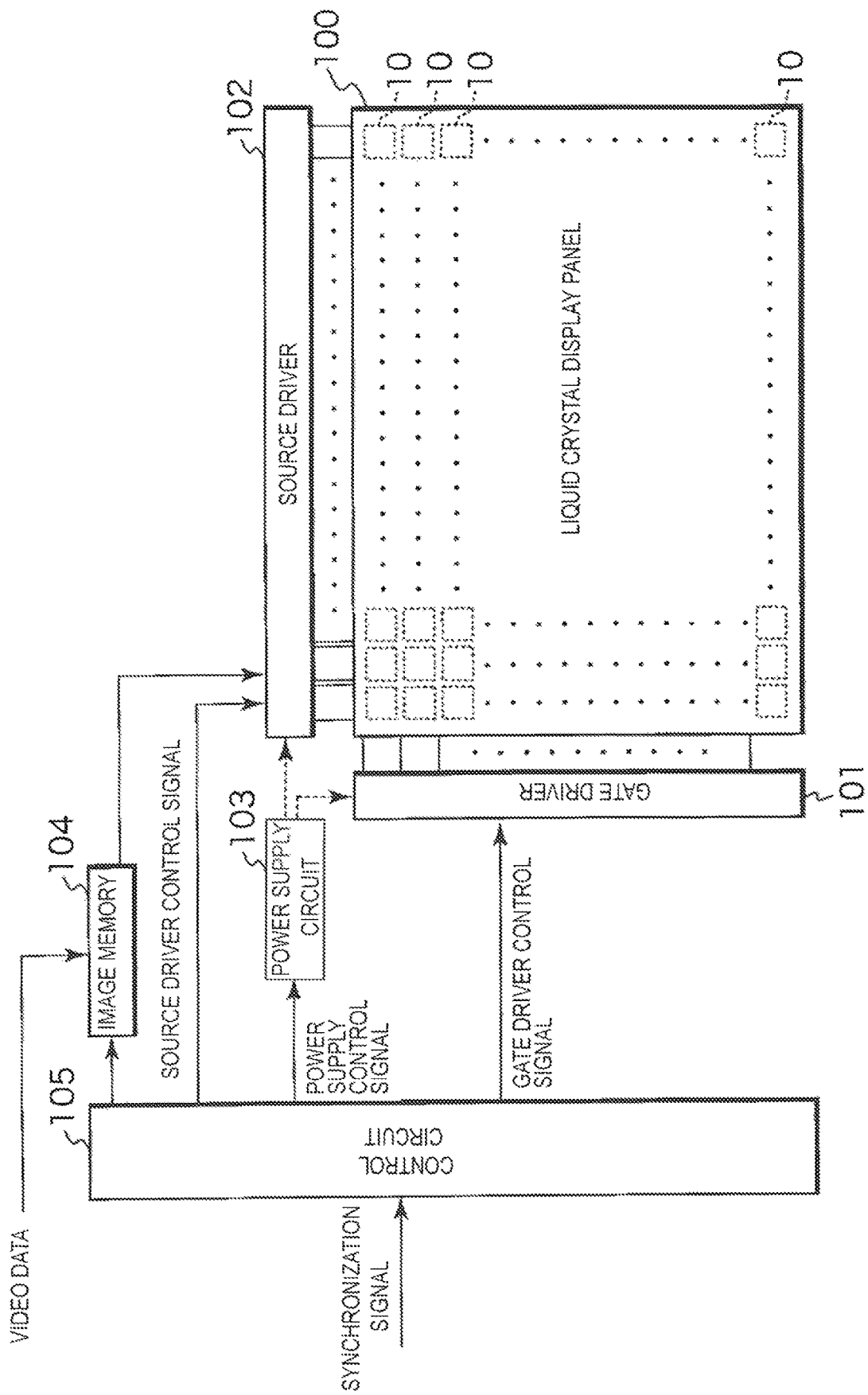
FIG. 13 is a block diagram illustrating the structure of a display device according to Embodiment 2.

FIG. 13 s a block diagram illustrating the configuration of the display device according to Embodiment 2. The display device shown in FIG. 13 is an exemplary liquid crystal display device, and includes a liquid crystal display panel 100, a gate driver 101, a source driver 102, a power supply circuit 103, an image memory 104 and a control circuit 105, for example.

The control circuit 105 outputs control signals for controlling the gate driver 101, the source driver 102, the power supply circuit 103 and the image memory 104 in sync with a synchronization signal from outside.

The image memory 104 temporarily stores video data of an object to be displayed, and outputs video data to the source driver 102 in accordance with a memory control signal that is input from the control circuit 105. Note that the image memory 104 may be provided in the control circuit 105 and configured to output video data to the source driver 102 via an internal process of the control circuit 105.

Based on a power supply control signal that is input from the control circuit 105, the power supply circuit 103 generates a drive voltage for the gate driver 101, a drive voltage for the source driver 102, etc., and supply the drive voltages to the gate &river 101 and the source driver 102.

Based on a gate driver control signal that is input from the control circuit 105, the gate driver 101 generates scanning signals for turning ON/OFF switching elements 11 (see FIG. 14) of pixels 10 that are arranged in a matrix pattern in the liquid crystal display panel 100, and successively apply the generated scanning signals to the gate lines connected to the gate driver.

Based on a source driver control signal that is input from the control circuit 105, the source driver 102 generates data signals in accordance with the video data input from the image memory 104, and successively apply the generated data signals to the source lines connected to the source driver 102. A data signal supplied from the source driver 102 through a source line is written on a pixel 10 if the corresponding switching element 11 is ON.

Note that while the present embodiment is directed to a configuration where the gate driver 101 and the source driver 102 are provided outside the liquid crystal display panel 100, the gate driver 101 and the source driver 102 may be provided along the periphery of the liquid crystal display panel 100.

Figure 14:
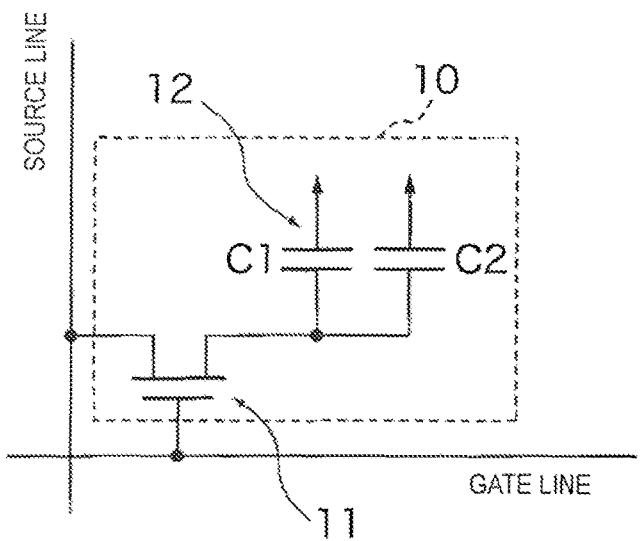
FIG. 14 is a circuit diagram illustrating an exemplary configuration of a pixel.

FIG. 14 is a circuit diagram illustrating an example configuration of each pixel 10. The pixel 10 includes the switching element 11 and a display element 12. The switching element 11 is a thin film transistor shown in Embodiment 1, for example, whose source electrode 6A is connected to a source line and whose drain electrode 6B is connected to a pixel electrode 9. The gate electrode 2 of the switching element 11 is connected to a gate line. The switching element 11 is turned ON/OFF in accordance with the scanning signal that is supplied to the gate line, and is capable of electrically detaching the pixel electrode 9 from the source line and electrically connecting the pixel electrode 9 to the source line.

The liquid crystal display panel 100 includes a counter electrode that opposes the pixel electrode A liquid crystal material is sealed in the space between the pixel electrode 9 and the counter electrode, thus forming a liquid crystal capacitor C1. The counter electrode is connected to a common voltage generation circuit (not shown), and the common voltage Vcom is applied thereto from the common voltage generation circuit, thereby holding the counter electrode at a fixed potential, for example.

Each pixel 10 includes a storage capacitor C2 that is connected in parallel to the liquid crystal capacitor C1, and is configured so that the storage capacitor C2 is also charged when a voltage is applied to the pixel electrode 9. Therefore, even in a period when no data voltage is applied through the source line, the voltage value of the pixels 10 can be held by the potential that is held by the storage capacitor C2.

The control circuit 105 of the liquid crystal display device controls the level of the voltage applied between the pixel electrode 9 and the counter electrode through the gate driver 101, the source driver 102, etc., and controls the transmittance of the liquid crystal material of each pixel 10, thereby displaying an image by adjusting the amount of light to pass through the liquid crystal material.

It is possible to realize a low power consumption by employing the thin film transistor shown in Embodiment 1 as the switching element 11 of each pixel 10. By employing the thin film transistor shown in Embodiment 1, it is possible to suppress variations in characteristics between thin film transistors, and it is therefore possible to maintain a good display quality of the liquid crystal display panel 100.

Note that while Embodiment 2 illustrates a liquid crystal display device as an exemplary display device, the thin film transistor illustrated in Embodiment 1 may be employed as a switching element for pixel selection or a switching element for pixel driving used in an organic EL display device.

The embodiments disclosed herein should be considered illustrative and non-limiting in every respect. The scope the present invention is defined not by the embodiments shown above, but by the claims set forth below, and is intended to include all modifications within the meaning and the scope equivalent to those claims.

Below is additional disclosure relating to the embodiments described above.

A thin film transistor according to one aspect of the present invention includes: a gate electrode formed on a substrate; a gate insulating layer formed so as to cover the gate electrode; a semiconductor layer formed on the gate insulating layer; and an etch stop film located above the gate electrode so as to cover a partial region of the semiconductor layer, wherein: the semiconductor layer is an oxide semiconductor layer including a compound of indium, gallium and zinc oxide; the crystallinity of the oxide semiconductor layer in the partial region thereof that is covered by the etch stop layer is different from the crystallinity of the oxide semiconductor layer in two regions thereof that are located on the opposite sides with respect to the partial region; and the thin film transistor includes a source electrode at least a portion of which is located above one of the two regions and a drain electrode at least a portion of which is located above the other one of the two regions, wherein the source electrode and the drain electrode are spaced apart from each other on the oxide semiconductor layer.

In the thin film transistor according to one aspect of the present invention, the oxide semiconductor layer in the partial region is a microcrystalline oxide semiconductor layer, and the oxide semiconductor layer in the two regions is a polycrystalline oxide semiconductor layer.

The thin film transistor according to one aspect of the present invention includes an amorphous oxide semiconductor layer in the same layer as the microcrystalline oxide semiconductor layer and the polycrystalline oxide semiconductor layer.

A display device according to one aspect of the present invention includes a plurality of display elements, and thin film transistors as set forth above for selecting or driving display elements to be lit.

A method for manufacturing a thin film transistor according to one aspect the present invention includes: forming a gate electrode on a substrate; forming gate insulating layer so as to cover the gate electrode; forming an oxide semiconductor including a compound of indium, gallium and zinc oxide on the gate insulating layer; forming an etch stop layer on the oxide semiconductor layer, wherein the etch stop layer has a film thickness determined so that an absorption rate of the oxide semiconductor layer for an energy beam to be projected takes a value within a predetermined range including a local minimum or a local maximum; removing a portion of the etch stop film so that the oxide semiconductor layer has two regions that are not covered by the etch stop film; and projecting the energy beam from above the etch stop film so that a crystallinity of the oxide semiconductor layer in a region that is covered by the etch stop film is different from a crystallinity of the oxide semiconductor layer in the two regions that are not covered by the etch stop film, thereby forming a source electrode at least a portion of which is located above one of the two regions and a drain electrode at least a portion of which is located above the other one of the two regions, wherein the source electrode and the drain electrode are spaced apart from each other on the semiconductor layer.

Figure 15:
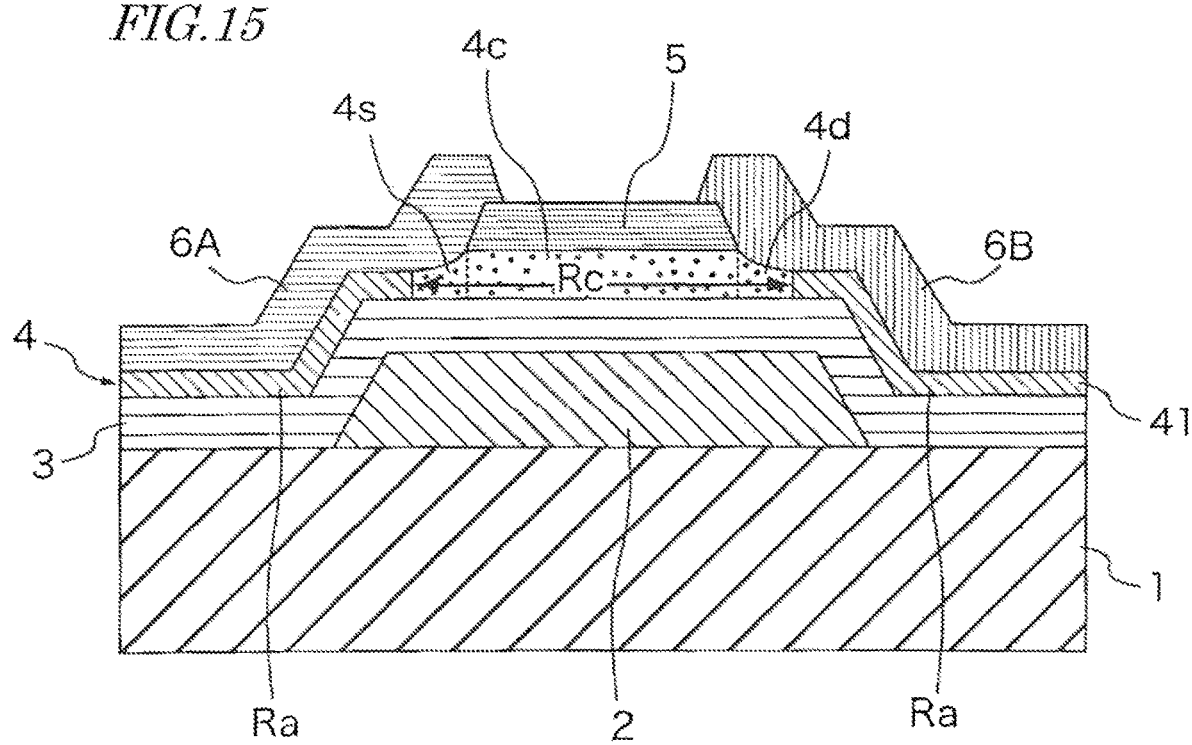
FIG. 15 is a cross-sectional view of a thin film transistor according to an embodiment of the present invention.
Figure 16A:
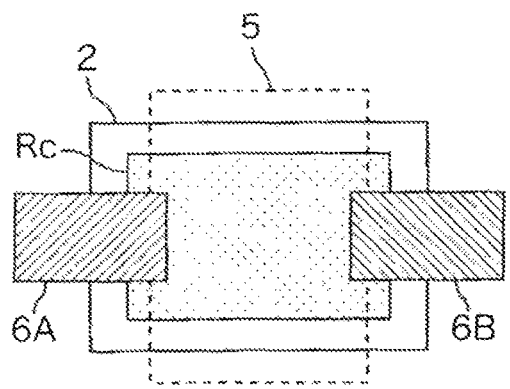
FIG. 16A shows a plan view showing still other example of the thin film transistor.
Figure 16B:
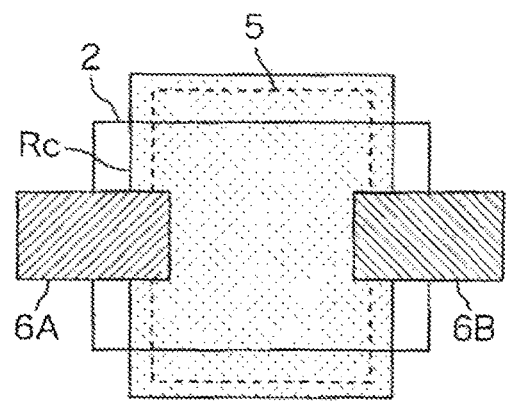
FIG. 16B show a plan view showing still other example of the thin film transistor.
Figure 16C:
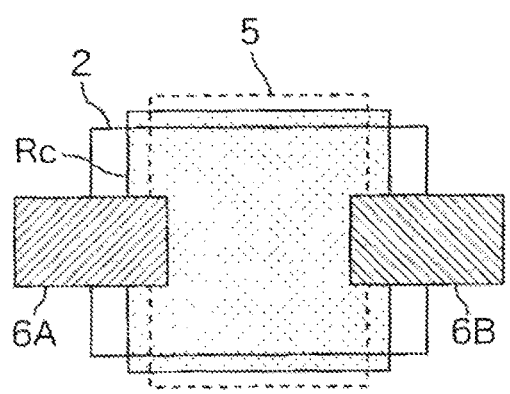
FIG. 16C shows a plan view showing still other example of the thin film transistor.
Figure 16D:
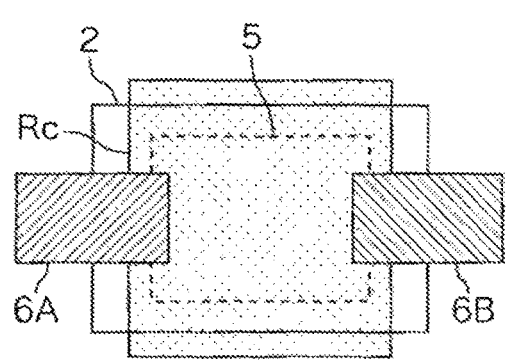
FIG. 16D shows a plan view showing still other example of the thin film transistor.
Figure 16E:
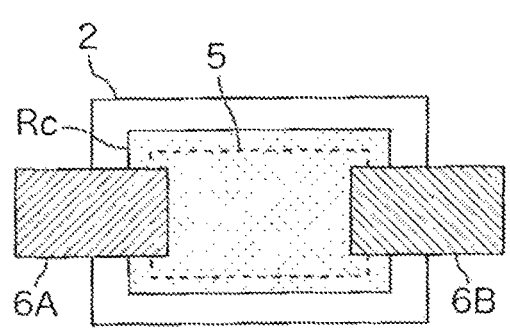
FIG. 16E shows a plan view showing still other example of the thin film transistor.
Figure 16F:
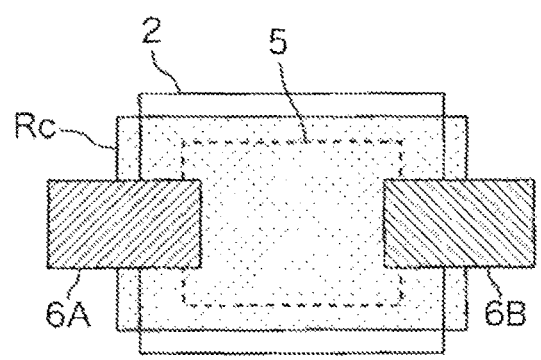
FIG. 16F shows a plan view showing still other example of the thin film transistor.

The configuration of the thin film transistor according to one aspect of the present invention will be further described with reference to FIG. 15.

The thin film transistor includes the substrate 1, the gate electrode 2 supported on the substrate 1, the gate insulating layer 3 that covers the gate electrode, the semiconductor layer (oxide semiconductor layer) 4 provided on the gate insulating layer 3 and having a crystalline region Rc, the protection insulating layer (referred to also as the etch stop layer) 5 arranged on a portion of the semiconductor layer 4, and the source electrode 6A and the drain electrode 6B.

Note that the "crystalline region Rc" as used in the present specification refers to a region that primarily includes a crystalline oxide semiconductor (including a polycrystalline oxide semiconductor, a microcrystalline oxide semiconductor, a monocrystalline oxide semiconductor, or a crystalline oxide semiconductor whose c axis is oriented generally perpendicular to the layer surface).

The crystalline region Rc includes a first region $4s$, a second region $4d$, and a channel region $4c$ that is located between the first region $4s$ and the second region $4d$. The first region $4s$ is a region (source contact region) that is electrically connected to the source electrode 6A. The second region $4d$ is a region (drain contact region) that is electrically connected to the drain electrode 6B. In the present embodiment, the channel region $4c$, the first region $4s$ and the second region $4d$ overlap with the gate electrode 2 with the gate insulating layer 3 interposed therebetween. The first region $4s$ may be in direct contact with the source electrode 6A. Similarly, the second region $4d$ may he in direct contact with the drain electrode 6B.

The protection insulating layer 5 is arranged on the semiconductor layer 4 so that the channel region $4c$ is covered and the first region $4s$ and the second region $4d$ are exposed. The protection insulating layer 5 may be in contact with the upper surface of the channel region $4c$. In the illustrated example, the protection insulating layer 5 is formed in an island-like pattern. Note that the protection insulating layer 5 may be formed so as to cover the entire semiconductor layer 4, and may have an opening through which the first region $4s$ of the semiconductor layer 4 is exposed, and an opening through which the second region $4d$ is exposed.

The protection insulating layer 5 functions as an etch stop layer for protecting the channel region $4c$ in the step of patterning the conductive film to form the source electrode 6A and the drain electrode 6B (the source-drain separation step). That is, the protection insulating layer 5 is formed below the conductive film (i.e., after forming the semiconductor layer 4 and before forming the conductive film for the source and drain electrodes). Therefore, a portion of the protection insulating layer 5 is located between the semiconductor layer 4 and the source electrode 6A, and another portion of the protection insulating layer 5 is located between the semiconductor layer 4 and the drain electrode 6B.

In the present embodiment, the crystallinity of the channel region $4c$ in the crystalline region Rc is lower than the crystallinity of the first region $4s$ and the second region $4d$. Such a crystalline structure can be manufactured by performing a crystallization step of projecting laser light from above the protection insulating layer 5 after forming the protection insulating layer 5 on a portion of the amorphous oxide semiconductor film, as described above, and controlling the laser light absorption rate of portion of the semiconductor film that is covered by the protection insulating layer 5 (i.e., the laser light reflectivity of the layered structure including the protection insulating layer 5).

As an example, the average grain size of the channel region $4c$ may be smaller than the average grain size of the first region $4s$ and the second region $4d$. Alternatively, the crystallization rate of the channel region $4c$ measured by using Raman spectroscopy may be smaller than the crystallization rate of the first region $4s$ and the second region $4d$. That is, the volume ratio of the amorphous phase included in the channel region $4c$ may be greater than the volume ratio of the amorphous phase included in the first region $4s$ and the second region $4d$.

The channel region $4c$, the first region $4s$ and the second region $4d$ may each include a microcrystalline oxide semiconductor. Alternatively, the channel region $4c$ may include a microcrystalline oxide semiconductor, and the first region $4s$ and the second region $4d$ may include a polycrystalline oxide semiconductor or a polycrystalline oxide conductor. Alternatively, the channel region $4c$ may include a polycrystalline oxide semiconductor, and the first region $4s$ and the second region $4d$ may include a polycrystalline oxide semiconductor or a polycrystalline oxide conductor.

The semiconductor layer 4 may further include a non-crystalline region Ra, in addition to the crystalline region Rc. For example, when only a portion of the amorphous oxide semiconductor film is crystallized through irradiation with laser light, the region irradiated with laser light becomes the crystalline region Rc, and the region not irradiated with laser light is left to remain as the non-crystalline region Ra. Regarding such a crystallization method, the disclosures of International Publication WO2011/055618 pamphlet, International Publication WO2011/132559 pamphlet, International Publication WO2016/157351 pamphlet and International Publication WO2016/170571 pamphlet are hereby incorporated by reference in their entirety.

The specific resistance of the crystalline region Rc may be lower than the specific resistance of the non-crystalline region Ra. The specific resistance of the first region 4s and the second region 4d may be lower than the specific resistance of the channel region 4c.

The semiconductor layer 4 may include indium, gallium and zinc. For example, it may include an In-Ga-Zn-O-based semiconductor. There is no particular limitation on the type and the composition of the oxide semiconductor included in the semiconductor layer 4. The oxide semiconductor may be an oxide including at least one of elements such as indium, gallium, zinc, tin, aluminum, silicon, germanium, titanium, molybdenum, boron and manganese. For example, it is possible to use an oxide semiconductor known in the art such as an In-Zn-O-based semiconductor and an In-Sn-Zn-O-based semiconductor. The material, the structure, the deposition method, etc., of he oxide semiconductor are described in Japanese Patient No. 6275294, for example. The disclosure of Japanese Patent No. 6275294 is hereby incorporated by reference in its entirety.

The thin film transistor of the present embodiment can be manufactured as follows, for example.

First, the gate electrode 2 and the gate insulating layer 3 covering the gate electrode 2 are formed on the substrate 1. Then, the semiconductor film 40 made of an amorphous oxide semiconductor is formed on the gate insulating layer 3. Then, an insulating film to be the protection insulating layer is formed on the semiconductor film 40 and the insulating film is patterned, thereby obtaining the protection insulating layer 5 that covers a portion of the semiconductor film 40 that is to be the channel region (see FIG. 3B).

Then, the semiconductor film 40 is irradiated with laser light from above the protection insulating layer 5 so as to crystallize the semiconductor film 40 so that in the region that overlaps with the gate electrode 2 as seen from the direction normal to the substrate 1, the crystallinity of a portion of the semiconductor film 40 that is covered by the protection insulating layer 5 is lower than the crystallinity of a portion thereof that is not covered by the protection insulating layer 5. Thus, the region irradiated with laser is crystallized, thereby obtaining the semiconductor layer 4 having the crystalline region Rc.

Then, the source electrode 6A and the drain electrode 6B are formed, wherein the source electrode 6A is electrically connected to a part (herein, the first region 4s) of a portion of the crystalline region Rc that is not covered by the protection insulating layer 5, and the drain electrode 6B is electrically connected to another part (herein, the second region 4d) of the portion of the crystalline region Rc that is not covered by the protection insulating layer 5. Thus, the thin film transistor is manufactured.

According to the present embodiment, portions (the first region 4s, the second region 4d and the channel region 4c) of the semiconductor layer (active layer) 4 of the thin film transistor that are to be the path of the current flow between the source electrode 6A and the drain electrode 6B are formed of a crystalline oxide semiconductor, and it is therefore possible to improve the channel mobility as compared with a TFT using an amorphous oxide semiconductor. With the crystallinity of the channel region 4c being lower than the crystallinity of the first region 4s and the second region 4d, it is possible to improve the mobility while suppressing an increase in the off current due to a decrease in the electric resistance of the channel region 4c. Therefore, it is possible to increase the ON characteristic while ensuring the intended OFF characteristic.

When manufacturing a thin film transistor by the method described above, after the protection insulating film is patterned to form the protection insulating layer 5, the semiconductor film 40 is irradiated with laser light from above the patterned protection insulating layer 5 for laser annealing. Therefore, the crystallinity can be varied between a portion of the semiconductor film 40 that is covered by the protection insulating layer 5 and another portion thereof that is not covered by the protection insulating layer 5. That is, it is possible to produce different regions with different crystallinities by utilizing the protection insulating layer 5, without performing a plurality of iterations of laser anneal under different irradiation conditions.

In the crystallization step described above, the semiconductor film 40 may be irradiated with laser light from above the protection insulating layer 5 so that in the region that overlaps with the gate electrode 2 as seen from the direction normal to the substrate 1, a portion of the semiconductor film 40 that is not covered by the protection insulating layer 5 is crystallized and another portion thereof that is covered by the protection insulating layer 5 is left to remain non-crystalline. As a result, the channel region 4c becomes a non-crystalline region, and the first region 4s and the second region 4d become a polycrystalline region or a microcrystalline region. Thus, it is possible to reduce the on resistance without increasing the off current.

Alternatively, the crystallization step described above may be performed so that the crystallinity of the channel region 4c is higher than that of the first region 4s and the second region 4d. Such a configuration is realized by performing the laser anneal from above the protection insulating layer 5 while setting the thickness of the protection insulating layer 5 to a thickness (thickness: 85 to 135 nm in the example shown in FIG. 5) such that the laser light absorption rate of the amorphous oxide semiconductor film 40 takes a value in the vicinity of the local maximum or the local maximum (a value within a predetermined range including the local maximum), for example. In such a case, the channel region 4c becomes a polycrystalline region, and the first region 4s and the second region 4d become microcrystalline regions, for example. Thus, a portion of the semiconductor layer (active layer) 4 that is to be the path of the current flow between the source electrode 6A and the drain electrode 6B is crystallized to increase the channel mobility so that a part of the current path portion has a lower crystallinity herein, the first region 4s and the second region 4d have a lower crystallinity), and it is therefore possible to suppress an increase in the off current.

The positional relationship between the gate electrode 2, the protection insulating layer 5 and the crystalline region Rc (the region irradiated with laser light) as seen from the direction normal to the substrate 1 is not limited to the examples shown in FIG. 1, FIG. 7 to FIG. 11. FIG. 16A to FIG. 16F are plan views showing still another examples of the thin film transistor. For example, arrangements illustrated in FIG. 16A to FIG. 16F are also possible. In any of the arrangements, the protection insulating layer 5 is arranged so as to overlap with only a portion of the gate electrode 2. The crystalline region Rc is arranged so as to overlap at least partially with the gate electrode 2. The crystalline region Rc includes a portion that overlaps with both of the gate electrode 2 and the protection insulating layer 5 and a portion that overlaps with the gate electrode 2 and does not overlap with the protection insulating layer 5.

For example, the protection insulating layer 5 may extend across the crystalline region Rc in the channel width direction of the thin film transistor as seen from the direction normal to the substrate 1. Alternatively, the protection insulating layer 5 may be in an island-like pattern, and may be located inside the crystalline region Rc as seen from the direction normal to the substrate 1. The crystalline region Rc may be located inside the gate electrode 2 as seen from the direction normal to the substrate 1. Alternatively, a portion of the crystalline region Rc does not need to overlap with the gate electrode 2. For example, the entirety of a semiconductor film made of an amorphous oxide semiconductor may be crystallized by using a laser anneal method that scans across the entire semiconductor film.

This application is based on Japanese Patent Applications No. 2018-123446 filed on Jun. 28, 2018, the entire contents of which are hereby incorporated by reference.

What is claimed is:

1. A thin film transistor comprising:
a substrate;
a gate electrode supported on the substrate;
a gate insulating layer that covers the gate electrode;
an oxide semiconductor layer provided on the gate insulating layer and having a crystalline region, the crystalline region including a first region, a second region, and a channel region located between the first region and the second region, wherein the channel region, the first region and the second region overlap with the gate electrode with the gate insulating layer interposed therebetween;
a protection insulating layer arranged on oxide semiconductor layer, the protection insulating layer covering the channel region but not covering the first region and the second region;
a source electrode electrically connected to the first region; and
a drain electrode electrically connected to the second region,
wherein a crystallinity of the channel region is lower than a crystallinity of the first region and the second region.

2. The thin film transistor according to claim 1, wherein an average grain size of the channel region is smaller than an average grain size of the first region and the second region.

3. The thin film transistor according to claim 1, wherein:
the channel region includes a microcrystalline oxide semiconductor; and
the first region and the second region include a polycrystalline oxide semiconductor or a polycrystalline oxide conductor.

4. The thin film transistor according to claim 1, wherein the oxide semiconductor layer further includes a non-crystalline region.

5. The thin film transistor according to claim 1, wherein a portion of the protection insulating layer is located between the oxide semiconductor layer and the source electrode, and another portion of the protection insulating layer is located between the oxide semiconductor layer and the drain electrode.

6. The thin film transistor according to claim 1, wherein the oxide semiconductor layer includes indium, gallium and zinc.

7. A display device comprising:
the thin film transistor according to claim 1; and
a display region having a plurality of pixels,
wherein the thin film transistor is arranged in each of the pixels.

8. The thin film transistor according to claim 1, wherein a part of an upper surface of the insulating protection layer is covered by the source electrode, and another part of the upper surface of the insulating protection layer is covered by the drain electrode.

9. A thin film transistor comprising:
a substrate;
a gate electrode supported on the substrate;
a gate insulating layer that covers the gate electrode;
an oxide semiconductor layer provided on the gate insulating layer, the oxide semiconductor layer including a first region, a second region, and a channel region located between the first region and the second region, wherein the channel region, the first region and the second region overlap with the gate electrode with the gate insulating layer interposed therebetween;
protection insulating layer arranged on the oxide semiconductor layer, the protection insulating layer covering the channel region but not covering the first region and the second region;
a source electrode electrically connected to the first region; and
a drain electrode electrically connected to the second region,
wherein the channel region is non-crystalline, and the first region and the second region are crystalline.

10. The thin film transistor according to claim 9, wherein a portion of the protection insulating layer is located between the oxide semiconductor layer and the source electrode, and another portion of the protection insulating layer is located between the oxide semiconductor layer and the drain electrode.

11. The thin film transistor according to claim 9, wherein the oxide semiconductor layer includes indium, gallium and zinc.

12. A display device comprising:
the thin film transistor according to claim 9; and
a display region having a plurality of pixels,
wherein the thin film transistor is arranged in each of the pixels.

13. The thin film transistor according to claim 9, wherein a part of an upper surface of the insulating protection layer is covered by the source electrode, and another part of the upper surface of the insulating protection layer is covered by the drain electrode.

14. A method for manufacturing a thin film transistor comprising:
a step (A) of providing a substrate including a gate electrode, and a gate insulating layer that covers the gate electrode, wherein the gate electrode and the gate insulating layer are formed an a surface of the substrate;
a step (B) of forming a semiconductor film made of an amorphous oxide semiconductor on the gate insulating layer;
a step (C) of forming an insulating film on the semiconductor film and patterning the insulating film, thereby forming a protection insulating layer that covers a portion of the semiconductor film that is to be a channel region;
a step (D) of irradiating the semiconductor film with laser light from above the protection insulating layer to crystallize a portion of the semiconductor film that is covered by the protection insulating layer and a portion thereof that is not covered by the protection insulating layer so that a crystallinity of the portion of the semiconductor film that is covered by the protection insulating layer is lower than the portion thereof is not covered by the protection insulating layer, in a region that overlaps with the gate electrode as seen from a direction normal to the substrate; and a step (E) of forming a source electrode electrically connected to a part of the portion of the semiconductor film that is not covered by the protection insulating layer, and a drain electrode electrically connected to another part of the portion of the semiconductor film that is not covered by the protection insulating layer.

15. The manufacturing method according to claim 14, wherein a wavelength of the laser light is about 248 nm, and the protection insulating layer is a silicon oxide layer.

16. The manufacturing method according to claim 14, wherein in the step (D), only a portion of the semiconductor film is irradiated with the laser light so that a portion of the semiconductor film that is not irradiated with the laser light is left to remain non-crystalline.

17. The manufacturing method according to claim 14, wherein the step (E) includes forming a metal film covering the insulating protection layer and the semiconductor film and then patterning the metal film to obtain the source electrode and the drain electrode, the source electrode covering a part of an upper surface of the insulating protection layer, and the drain electrode covering another part of the upper surface of the insulating protection layer.

* * * * *